United States Patent
Vercruysse et al.

(10) Patent No.: US 11,121,274 B2
(45) Date of Patent: Sep. 14, 2021

(54) BACKSHEET FOR A SOLAR CELL MODULE

(71) Applicant: AGFA-GEVAERT NV, Mortsel (BE)

(72) Inventors: Geert Vercruysse, Mortsel (BE); Hanne Verwaest, Mortsel (BE); Carlo Uyttendaele, Mortsel (BE); Hubertus Van Aert, Mortsel (BE)

(73) Assignee: AGFA-Gevaert NV, Mortsel (BE)

( * ) Notice: Subject to any disclaimer, the term of this patent is extended or adjusted under 35 U.S.C. 154(b) by 601 days.

(21) Appl. No.: 16/063,710

(22) PCT Filed: Dec. 12, 2016

(86) PCT No.: PCT/EP2016/080590
§ 371 (c)(1),
(2) Date: Jun. 19, 2018

(87) PCT Pub. No.: WO2017/108471
PCT Pub. Date: Jun. 29, 2017

(65) Prior Publication Data
US 2020/0266312 A1    Aug. 20, 2020

(30) Foreign Application Priority Data

Dec. 23, 2015   (EP) .................................. 15202413

(51) Int. Cl.
*H01L 31/049*   (2014.01)
*C09J 175/04*   (2006.01)
*H01L 31/048*   (2014.01)
*H01L 31/18*    (2006.01)

(52) U.S. Cl.
CPC .......... *H01L 31/049* (2014.12); *C09J 175/04* (2013.01); *H01L 31/0481* (2013.01); *H01L 31/18* (2013.01)

(58) Field of Classification Search
None
See application file for complete search history.

(56) References Cited

U.S. PATENT DOCUMENTS

| | | | | |
|---|---|---|---|---|
| 8,569,611 B2* | 10/2013 | Wu | ....................... | B32B 27/308 |
| | | | | 136/252 |
| 9,683,127 B2* | 6/2017 | Steinbrecher | ...... | C08G 18/6674 |
| 9,944,771 B2* | 4/2018 | Lucas | ....................... | C08K 5/17 |
| 2009/0151774 A1 | 6/2009 | Depine et al. | | |
| 2010/0183883 A1* | 7/2010 | Schaefer | .............. | C09D 175/04 |
| | | | | 428/423.1 |
| 2013/0068304 A1* | 3/2013 | Kanematsu | .......... | C09K 3/1018 |
| | | | | 136/259 |
| 2013/0284245 A1* | 10/2013 | Kim | ........................ | C08F 14/22 |
| | | | | 136/252 |
| 2013/0309505 A1* | 11/2013 | Kim | ..................... | H01L 31/048 |
| | | | | 428/422 |
| 2014/0034109 A1* | 2/2014 | Kim | ..................... | C09D 127/16 |
| | | | | 136/244 |
| 2015/0303338 A1 | 10/2015 | Kwon et al. | | |
| 2016/0037632 A1* | 2/2016 | Murakawa | .......... | H05K 1/0298 |
| | | | | 174/257 |
| 2016/0126384 A1* | 5/2016 | Van Aert | .............. | C09D 133/14 |
| | | | | 136/251 |
| 2016/0362625 A1* | 12/2016 | Sakurai | .................. | C08G 18/10 |
| 2017/0015870 A1* | 1/2017 | Nishijima | .............. | C09J 123/22 |
| 2017/0088742 A1* | 3/2017 | Kues | ..................... | H01L 31/049 |

FOREIGN PATENT DOCUMENTS

| | | |
|---|---|---|
| JP | 2002-194045 A | 7/2002 |
| JP | 2006083372 A | 3/2006 |
| JP | 2012-182425 A | 9/2012 |
| JP | 2013-258326 A | 12/2013 |
| WO | 2010/101582 A1 | 9/2010 |

OTHER PUBLICATIONS

Machine translation of JP-2013258326, translation generated Jan. 2021, 48 pages. (Year: 2021).*
Data sheet for Duranate water-dispersible grades, 2 pages. (Year: 2021).*
Official Communication issued in International Patent Application No. PCT/EP2016/080590, dated Mar. 8, 2017.
Asahi Kasei Chemicals Corporation Performance Coating Materials Division, "Durante HDI polyisocyanate for non-yellowing polyurethanes", XP055253427, Jan. 1, 2015, pp. 1-10.
Office Action relating to Japanese Patent Application No. JP2018-217144 dated Jan. 6, 2021, 4 pages.

* cited by examiner

*Primary Examiner* — Robert S Loewe
(74) *Attorney, Agent, or Firm* — Leydig, Voit & Mayer, Ltd.

(57) ABSTRACT

A backsheet for a photovoltaic module includes a support, an adhesive layer provided on one side of the support, and an outer layer provided on the other side of the support, characterized in that at least one of the adhesive layer and the outer layer is coated from an aqueous composition, and the aqueous composition includes a water soluble or dispersible binder and a water dispersible core/shell polyisocyanate.

7 Claims, 2 Drawing Sheets

Figure 01: A light microscopy photograph (magnification 50X) of the adhesion layers 01 (top left); 02 (top right); 03 (bottom left); and 04 (bottom right) of example 1.
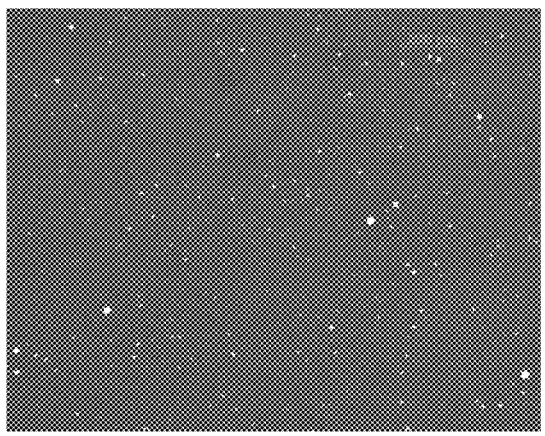
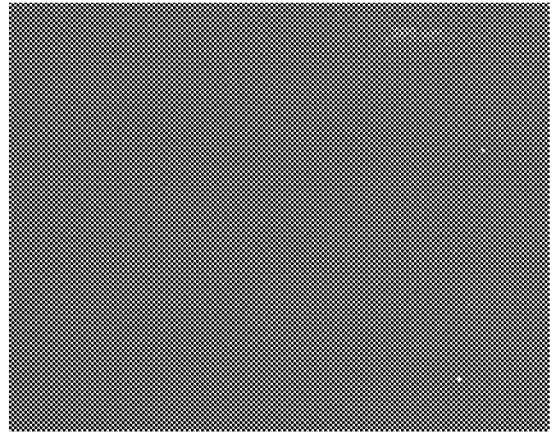
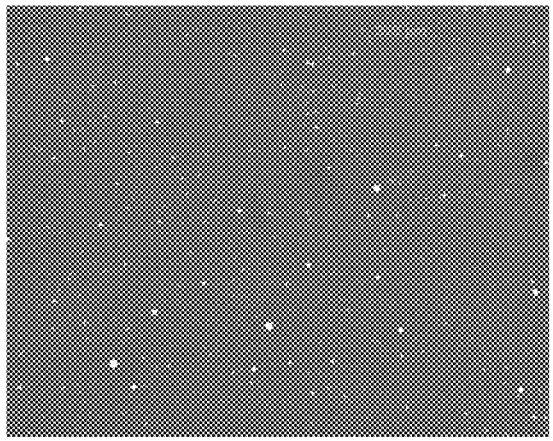
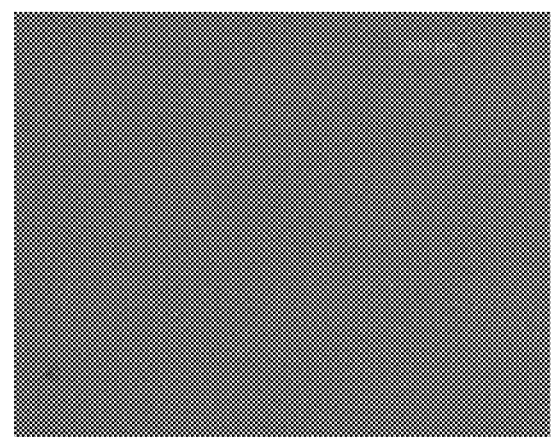

FIGURE 02: A schematic representation of an embodiment of a photovoltaic module according to the present invention.
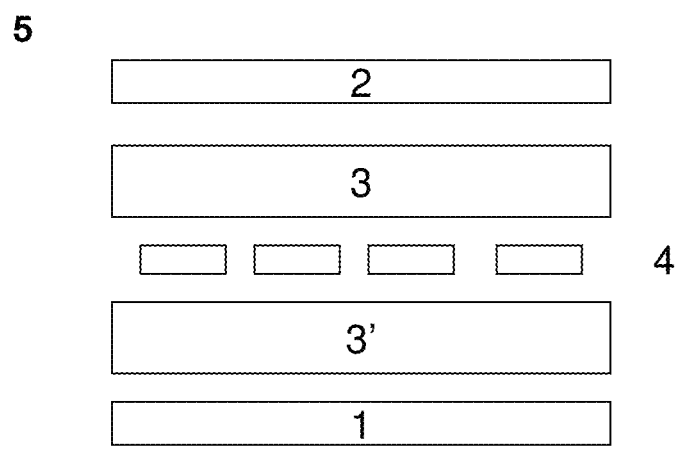
Figure 03: Schematic representation of an embodiment of a backsheet according to the present invention.
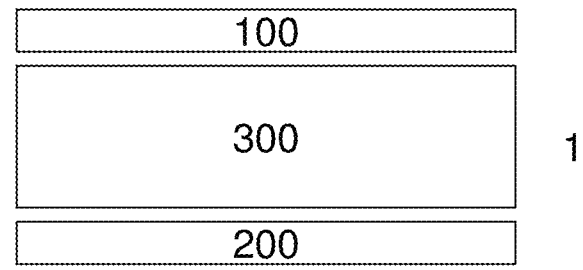

BACKSHEET FOR A SOLAR CELL MODULE

CROSS REFERENCE TO RELATED APPLICATIONS

This application is a 371 National Stage Application of PCT/EP2016/080590, filed Dec. 12, 2016. This application claims the benefit of European Application No. 15202413.9, filed Dec. 23, 2015, which is incorporated by reference herein in its entirety.

BACKGROUND OF THE INVENTION

1. Field of the Invention

The invention relates to a backsheet for a photovoltaic module and to a method to prepare such a backsheet.

2. Description of the Related Art

With increasing energy prices and increasing concern over the scarcity and the environmental impact of hydrocarbon fuels, industry is turning to alternative energy sources, such as solar energy.

Photovoltaic (PV) modules, also known as solar modules, are used to produce electrical energy from sunlight. Such modules are based on a variety of semiconductor cell systems (the solar cell) that can absorb light and convert it into electrical energy.

In a typical PV module, the solar cell arrays are positioned between two encapsulant layers, which are further positioned between a front sheet (upper side of the module facing the incoming light) and a backsheet (back side of the module). The most widely used encapsulant is EVA, i.e. Ethylene Vinyl Acetate.

The backsheet provides weather resistance, UV resistance, moisture barrier properties, low dielectric constant and a high breakdown voltage to the solar cell module. To provide such properties to the PV module, a backsheet comprises a weather resistant film, for example a Tedlar™ film, and/or a polyethylene-terephthalate (PET) film. For example a TPT type backsheet, wherein a Tedlar™ film is laminated on both sides of a PET film, or a TPE type backsheet, wherein a Tedlar™ is laminated on one side of a PET film, while on the other side an encapsulant adhesion layer is provided, are nowadays widely used as backsheet on the market.

Instead of laminating a weather resistant sheet on a support it may be advantageous to coat a weather resistant layer on a support, for example to decrease the cost price of the backsheet. Such a weather resistant layer may be coated from an aqueous or a non-aqueous coating solution. US2009/0151774 for example discloses a backsheet wherein the weather resistant layer is coated on a plastic support instead of laminated.

A backsheet typically comprises an adhesion layer on one side of a support to improve the adhesion of the backsheet towards the encapsulant and a weather resistant outer layer on the other side of the support.

From an environmental point of view it is preferred to use aqueous coating solutions for the adhesion layer and/or the outer layer. Moreover, such aqueous coating solution may be coated inline during the production of the support, making the process of manufacturing the backsheet more cost effective.

An adhesive and/or outer layer typically contains binders and crosslinking agents. Upon curing, for example by heating, the layers become cured resulting in improved physical properties.

Such crosslinking agents are often polyisocyanate compounds.

An advantage of polyisocyanate crosslinking agents are they high curing speed. It has now been observed that using such polyisocyanate compounds in aqueous layers may result in pinholes, poor adhesion or increased yellowing of the layer upon storage under hot and humid conditions.

SUMMARY OF THE INVENTION

Preferred embodiments of the present invention provide a backsheet for a PV module, wherein the backsheet comprise an aqueous adhesion and/or outer layer having no or a low amount of pinholes, a good adhesion and acceptable yellowing upon storage under hot and humid conditions.

The above advantages and benefits are realized by the backsheet as defined below.

Further advantages and embodiments of the present invention will become apparent from the following description.

BRIEF DESCRIPTION OF THE DRAWINGS

FIG. 1 shows light microscopy photographs of the adhesion layers of Example 1.

FIG. 2 shows an embodiment of a backsheet according to the present invention.

FIG. 3 shows an embodiment of a photovoltaic module according to the present invention.

DETAILED DESCRIPTION OF THE PREFERRED EMBODIMENTS

Definitions

The terms polymeric supports and sheets as used herein, mean a self-supporting polymer-based sheet, which may be associated with one or more subbing layers. Polymeric supports are usually manufactured through extrusion. Polymeric sheets are usually laminated, optionally via an adhesive, on a (polymeric) support.

The term layer, as used herein, is considered not to be self-supporting and is manufactured by coating it on a (polymeric) support or foil.

PET is an abbreviation for polyethylene terephthalate.

BOPET is an abbreviation for biaxially orientated PET.

Backsheet

A backsheet (1) for a photovoltaic module (5) according to the present invention comprises:

a support (300), an adhesive layer (100) provided on one side of the support, and an outer layer (200) provided on the other side of the support, characterized in that at least one of the adhesive layer and the outer layer is coated from an aqueous composition, the aqueous composition comprising a water soluble or dispersible binder and a water dispersible core/shell polyisocyanate.

An aqueous composition or coating solution referred to in the present invention means a composition or solution wherein the solvent includes 60 wt % or more, more preferably 80 wt % or more, most preferably 90 wt % or more of water.

The adhesion layer is located on the side of the support facing the encapsulant (3') and ensures a good adhesion between the backsheet and the encapsulant.

The weather resistant layer is located on the other side of the support facing the outside of the backsheet and ensures good weathering properties of the backsheet.

A primer layer may be provided between the support and the adhesion layer or the weather resistant outer layer.

The backsheet may comprise an adhesive layer on one side of the support coated from an aqueous composition comprising a water soluble or dispersible binder and a water dispersible core/shell polyisocyanate and an outer layer formed by laminating a polymer sheet, typically a polyvinylidene fluoride (PVDF) or polyvinyl fluoride (PVF), on the other side of the support.

The backsheet may also comprise an adhesive layer on one side of the support coated from an aqueous composition comprising a water soluble or dispersible binder and a water dispersible core/shell polyisocyanate and an outer layer coated from a solvent based, i.e. non-aqueous, composition.

The backsheet may also comprise an outer layer coated from an aqueous composition comprising a water soluble or dispersible binder and a water dispersible core/shell polyisocyanate and an adhesion layer on the other side of the support coated from a solvent based, i.e. non-aqueous, composition The backsheet preferably comprises an adhesion layer on one side of the support and an outer layer on the other side of the support, both layers coated from an aqueous composition comprising a water soluble or dispersible binder and a water dispersible core/shell polyisocyanate.

The adhesion layer preferably comprises from 0.05 to 5 g/m$^2$, more preferably from 0.1 to 1 g/m$^2$, of the core/shell polyisocyanate.

The weather resistant layer preferably comprises from 0.1 to 25 g/m$^2$, more preferably from 1 to 10 g/m$^2$, of the core/shell polyisocyanate.

The weather resistant layer preferably comprises a binder having a crosslinkable group, preferably a hydroxyl group. Upon curing, the isocyanate groups of the core/shell polyisocyanate may react with the hydroxyl group of the binder resulting in a crosslinked binder.

To ensure sufficient crosslinking, the total amount of NCO group relative to the total amount of hydroxylgroups of the weather resistant layer if preferably between 0.25 and 1.50, more preferably between 0.50 and 1.25, most preferably between 0.75 and 1. When the ratio of the NCO groups to the hydroxyl groups is too high, for example above 1, yellowing of the layer upon storage at high temperatures and high humidity has been observed.

To minimize the amount of NCO groups and ensure sufficient crosslinking efficiency, the core/shell polyisocyanate compound may be combined with other crosslinking agents, such as oxazolines or carbodiimides.

Core/Shell Polyisocyanate Compound

The crosslinking agent used in the water based adhesion layer and/or outer layer according to the present invention is a water dispersible core/shell polyisocyanate.

The core of the polyisocyanate preferably includes a hydrophobic polyisocyanate and the shell of the polyisocyanate compound includes a polymer comprising a hydrophilic dispersing group and a hydrophobic isocyanate-shielding group.

The polymer comprising a hydrophilic dispersing group and a hydrophobic isocyanate-shielding group is capable of dispersing the hydrophobic polyisocyanate in an aqueous medium, due to the hydrophilic dispersing groups, and to protect the isocyanate groups of the hydrophobic polyisocyanate from water, due to the isocyanate shielding group.

The polymer comprising a hydrophilic dispersing group and a hydrophobic isocyanate-shielding group is preferably covalently bonded to the hydrophobic polyisocyanate.

The content of isocyanate groups is preferably from 2.5 to 50 wt %, more preferably from 5 to 20 wt %, most preferably from 10 to 20 wt %, relative to the total weight of the core/shell polyisocyanate.

Core

The core of the polyisocyanate preferably includes a hydrophobic polyisocyanate.

The hydrophobic polyisocyanates may be aliphatic diisocyanates such as 1,4-tetramethylene diisocyanate, ethyl(2,6-diisocyanato) hexanoate, 1,6-hexamethylene diisocyanate, 1,12-dodecamethylene diisocyanate, 2,2,4- or 2,4,4-trimethylhexamethylene diisocyanate; aliphatic triisocyanates such as 1,3,6-hexamethylene triisocyanate, 1,8-diisocyanato-4-isocyanatomethyloctane, or 2-isocyanatoethyl(2,6-diisocyanato) hexanoate; alicyclic diisocyanates such as 1,3- or 1,4-bis(isocyanatomethylcyclohexane), dicyclo methane-4,4'-diisocyanate, 1,3- or 1,4-diisocyanato-cyclo-hexane, 3,5,5-trimethyl(3-isocyanato-3-methyl)cyclohexyl isocyanate, dicyclo-hexylmethane-4,4'-diisocyanate, or 2,5- or 2,6-diisocyanatomethylnorbornane; alicyclic triisocyanates such as 2,5- or 2,6-diisocyanatomethyl-2-isocyanato propyl-norbornane; aralkylene diisocyanates such as m-xylylene diisocyanate or a,a,a',a'-tetramethyl-m-xylylene diisocyanate; aromatic diisocyanates such as m- or p-phenylene diisocyanate, tolylene-2,4- or 2,6-diisocyanate, diphenylmethane-4,4'-diisocyanate, naphthalene-1,5-diisocyanate, diphenyl-4,4'-diisocyanate, 4,4'-diisocyanato-3,3'-dimethyldiphenyl, 3-methyl-diphenylmethane-4,4'-diisocyanate, or diphenyl ether-4,4'-diisocyanate; aromatic triisocyanates such as triphenylmethane triisocyanate or tris (isocyanatophenyl)-thiophosphate; diisocyanates or polyisocyanates having an urethodione structure obtained by cyclodimerization of isocyanate groups of various diisocyanates and triisocyanates described above; polyisocyanates having an isocyanurate structure obtained by cyclodimerization of isocyanate groups of various diisocyanates and triisocyanates described above; polyisocyanates having a biuret structure obtained by reacting various diisocyanates or triisocyanates described above with water; polyisocyanates having an oxadiazinetrione structure obtained by reacting various diisocyanates or triisocyanates with carbon dioxide; and polyisocyanates having an allophanate structure.

Preferred hydrophobic polyisocyanates are aliphatic or alicyclic di- or triisocyanates, aralkylene diisocyanates, or a polyisocyanates derived therefrom, in view of the stability of isocyanate groups in water and the weather resistance of a cured layer containing such polyisocyanates.

Highly preferred polyisocyanates are polyisocyanates having three or more functionalities such as isocyanurate type polyisocyanate, polyisocyanate having a biuret structure, polyisocyanate having an urethodione structure, polyisocyanate having an allophanate structure, or polyisocyanates obtained by reacting diisocyanate with polyhydric alcohol having three or more functionalities.

The core of the polyisocyanate preferably includes an aliphatic polyisocyanate or a trimer derived therefrom. It has been observed that aromatic polyisocyanates may result in more yellowing of the layer upon storage under warm and humid conditions or after extensive exposure to UV radiation.

Particularly preferred, the core of the polyisocyanate compound includes a hexamethylene diisocyanate (HDI) or an isocyanurate trimer derived therefrom, an isophorone diisocyanate (IPDI)-based isocyanurate, or a dicyclohexylmethane diisocyanate ($H_{12}MDI$)-based isocyanurate.

Shell

The shell of the polyisocyanate compound preferably includes a polymer comprising a hydrophilic dispersing group and a hydrophobic isocyanate-shielding group.

The hydrophilic dispersing group is preferably selected from the group consisting of a polyoxyalkylene group, a sulfate group, a sulfonate group, a phosphate group, a phosphonate group and a carboxylic group.

The carboxylic group as hydrophilic dispersing group may refer to a carboxylic acid or a salt thereof.

A highly preferred hydrophilic dispersing group is a polyoxyalkylene group, in particular a polyoxyethylene group.

The isocyanate shielding group is preferably selected from the group consisting of a polyacrylate, a polyester, a polyether, a polyurethane, a fluoropolymer, a polycarbonate, a polyamide, and a polyolefin.

A highly preferred isocyanate shielding group is a polyacrylate. In case of a polyacrylate, it is easy to incorporate therein a reactive group, i.e. a group that may react with the hydrophobic polyisocyanate and a hydrophilic group (see below). In addition, the glass transition temperature (Tg) and the hydrophobicity of the polyacrylate can be easily optimized.

Preparation of the Core/Shell Polyisocyanate

A preferred water dispersible core/shell polyisocyanate is the reaction product of:
a) a hydrophobic polyisocyanate, and
b) a polymer having a hydrophilic group and a reactive group capable of reacting with an isocyanate group.

A core/shell polyisocyanate comprising a hydrophobic polyisocyanate and a polyether comprising a hydrophilic dispersing group and a hydrophobic isocyanate shielding group is disclosed in EP-A 1788050, paragraphs [0031] to [0037].

Examples of polyether compounds having both hydrophilic groups and reactive groups capable of reacting with an isocyanate group are polyethers having hydroxyl groups such as monoalkoxy polyoxyethylene glycol, monoalkoxy polyoxyethylene-polyoxypropylene glycol, polyoxyethylene glycol, polyoxyethylene-polyoxypropylene glycol can be mentioned. These may be used alone or as a mixture of two or more kinds.

Reaction of a hydrophobic polyisocyanate with the above-mentioned polyether having hydrophilic groups and reactive groups capable of reacting with an isocyanate group result in a hydrophobic polyisocyanate covalently bonded to a polymer comprising an isocyanate shielding group, i.e. a polyether, and hydrophilic groups.

To enhance the isocyanate shielding property it may be advantageous to incorporate hydrophobic groups into the polyether. Such hydrophobic groups typically have three or more carbon atoms and include an alkyl group such as n-propyl group, iso-propyl group, n-butyl group, and hexyl group; an alicyclic alkyl group such as cyclopentyl group, and cyclohexyl group; an aromatic group such as phenyl group.

A core/shell polyisocyanate comprising a hydrophobic polyisocyanate and a vinylpolymer comprising a hydrophilic dispersing group and a hydrophobic isocyanate shielding group is disclosed in EP-A 1788050, paragraphs [0038] to [0052], and EP-A 1329468, paragraphs [0017] to [0095].

A particular preferred vinyl polymer is a polyacrylate comprising a hydrophilic dispersing group and a hydrophobic isocyanate shielding group.

A vinyl polymer comprising a hydrophilic dispersing group and a reactive group capable of reacting with an isocyanate group may be obtained by copolymerizing vinyl monomers having hydrophilic groups and vinyl monomers having a reactive group.

Examples of vinyl monomers having hydrophilic groups are vinyl monomers having alkoxy-polyoxyethylene groups, such as methoxypolyethylene glycol (meth) acrylate, (such as Bisomer® S20 W supplied by Geo Chemicals), butoxypolyethylene glycol (meth)acrylate, methoxypolyoxyethylenevinyl, and vinyl monomers having anionic groups, such as sodium alkylaryl sulfonate, sodium alkylaryl phosphate, 2-sulfoethyl methacrylate, 2-Acrylamido-2-MethylPropane Sulfonic Acid (e.g. AMPS 2401 supplied by Lubrizol).

Examples of reactive groups capable of reacting with an isocyanate group are a hydroxyl group, an amino group, a carboxyl group, a phosphate group, a phosphite group, a sulfonate group, a sulfinate group, a mercapto group, a silanol group, an activated methylene group, a carbamate group, an ureido group, carboxylic acid amide group, or a sulfonic acid amide group. Preferred reactive groups are a hydroxyl group, an amino group, a carboxyl group, and an activated methylene group because they are easy to incorporate into the vinyl polymer. Particularly preferred reactive groups are a hydroxyl group and a carboxylic group.

Examples of vinyl monomers containing a reactive group are acrylate monomers such as 2-hydroxyethyl acrylate, 2-hydroxyethyl methacrylate, or 2-hydroxypropyl methacrylate.

To enhance the isocyanate shielding property it may be advantageous to incorporate hydrophobic groups into the vinyl polymer. This may be achieved by copolymerizing vinyl monomer having a hydrophobic group with the vinyl monomers having a hydrophilic group and the vinyl monomers having a reactive group.

Examples of vinyl monomers having a hydrophobic are vinyl monomers having a hydrophobic group which includes four or more carbon atoms, such as for example a n-butyl group, an iso-butylgroup, a tert-butyl group, a n-pentyl group, n-hexyl group, a 2-ethylhexyl group, a n-octyl group, a n-dodecyl group and a n-octadecyl group; or a cycloalkyl group having four or more carbon atoms, such as a cyclopentyl group, a cyclohexyl group, a cyclooctyl group, a dicyclopentanyl group, a bornyl group, and an isobornyl group.

Preferred vinylmonomers having a hydrophobic group are acrylate monomers such as n-butyl acrylate or n-butyl methacrylate.

Other vinyl monomers may be used in addition to the above-described vinyl monomers to further optimize the properties of the polymer having a hydrophilic dispersing group and a hydrophobic isocyanate shielding group.

As examples of such other vinyl monomers, acrylic monomers such as methyl acrylate and methyl methacrylate can be mentioned.

The weight average molecular weight of the vinyl polymer having hydrophilic groups and isocyanate groups is preferably within the range of 2000 to 100000, more preferably within the range of 3000 to 50000.

Another polymer comprising a hydrophilic dispersing group and a hydrophobic isocyanate shielding group is for example a polyester copolymer of sulfoisophthalic acid having hydroxyl end groups. The sulfoisophthalic groups, i.e. the hydrophilic dispersing groups, provide a good dispersability in water. The hydroxyl groups, i.e. the reactive groups, are able to react with the hydrophobic polyisocyanate resulting in a covalent bonding between the isocyanate (core) and the polyester (shell).

Further examples of groups which can provide a hydrophilic dispersing group are 3-[(2-aminoethyl)amino]-1-Propanesulfonic acid (e.g. available under the tradename EPS at Raschig GmbH). In this case the amino group can react with the hydrophobic isocyanate forming a covalent urea bond.

The weight ratio of the hydrophobic polyisocyanate to the polymer comprising a hydrophilic dispersing group and a hydrophobic isocyanate shielding group is preferably between 30/70 to 85/15, more preferably between 50/50 to 80/20, most preferably between 60/40 to 80/20.

The preparation of the polyisocyanate compound according to the present invention as described above is preferably carried out in a non-reactive water miscible solvent such as for example 1-Methoxy-2-propylacetate.

Upon bringing the polyisocyanate compound in an aqueous medium, the compound forms a core/shell structure wherein the core is formed by the hydrophobic polyisocyanate and the shell is formed by the polymer comprising a hydrophilic dispersing group and a hydrophobic isocyanate-shielding group.

When making an aqueous dispersion of the polyisocyanate compound, it has been observed that regarding the avoidance of pinhole formation in the aqueous adhesion and outer layer, it is preferred to add the polyisocyanate compound to water instead of the other way around.

The shielding of the isocyanate groups in the core of the polyisocyanate compound from the aqueous medium by the shell can be optimized in various ways.

The thickness of the shell can be varied by:
the weight ratio of the hydrophobic polyisocyanate and the polymer comprising the hydrophilic groups and the cyanate shielding group,
the hydrophobicity of the polymer comprising the hydrophilic groups and the isocyanate shielding group,
the ratio of isocyanate groups (of the hydrobic polyisocyanate) to the amount of reactive groups of the polymer comprising the hydrophilic groups and the isocyanate shielding group. If more NCO is consumed by the reaction of the hydrophobic polyisocyanate and the reactive polymer comprising the hydrophilic groups and the cyanate shielding group, less isocyanate groups remain available. The amount of reactive groups of the reactive polymer comprising the hydrophilic groups and the isocyanate shielding group determines both the thickness of the shell and the amount of available isocyanate groups,
adopting the glass transition temperature (Tg) of the shell polymer. A low Tg polymer may have the advantage to form a good covering shell since the polymer is still mobile at a temperature below ambient temperatures.

The Tg of the polymer comprising the hydrophilic groups and the isocyanate shielding group is preferably lower than 25° C., in particular for acrylate polymers. For polyurethane or polyester polymers, the Tg of the polymer is less critical as film formation for these polymers is less dependent on Tg or Tm.

Aqueous Adhesion Layer

The aqueous adhesion layer comprises a water soluble or dispersible binder and a crosslinking agent, wherein the crosslinking agent is a water dispersable core/shell polyisocyanate.

The aqueous adhesion layer preferably further comprises a white pigment, an UV absorber and an inorganic oxide filler. The adhesion layer may further comprise additional crosslinking agents, surfactants, or matting agents.

Water Soluble or Dispersible Binder

The adhesion layer comprises a water soluble or dispersible binder.

The binder may comprise a crosslinkable group, also referred to as a functional group or a curable group. Such a crosslinkable group may be selected from a hydroxyl group, a carboxyl group, an amino group, a glycidyl group, a silyl group, a silanate group, an epoxy group, a 1,3-dicarbonyl group (e.g. aceto acetoxy methacrylate of diacetone acrylamide), or an isocyanate group. Among these, a hydroxyl group is particularly preferred.

There are no particular limitations on the binder as long as the binder is water soluble or water dispersible. The binder may be selected from a polyolefin, a polyurethane (PU) based polymer, a polyvinyl alcohol (PVA), a polyacrylic (acrylic resin) and a polyester.

Preferred binders are an acrylic resin, a polyolefin or a polyurethane based polymer.

Other preferred binders are urethane-acrylic hybrid polymers, i.e. a composite resin. Also a composite resin of acrylic and silicone may be used.

The adhesion layer may also comprise a combination of the above disclosed binders.

The polyolefin binder is preferably a modified polyolefin, and more preferably an acid-modified polyolefin.

The acidic unit used in the polyolefin resin is preferable a (meth)acrylic acid unit, and more preferably an acrylic acid unit.

Some or all of the acidic units of the polyolefin resin are preferably neutralized by a cation. The cation may be a metal, such as a sodium ion, a zinc ion, a magnesium ion, a copper ion, a lithium ion or a potassium ion; or an amine or ammonia. The metal ion is preferably a sodium ion or a zinc ion, the amine or ammonia is preferably triethylamine, N, N'-dimethylethanolamine, or ammonia.

Examples of the polyolefin include CHEMIPEARL® S-120, S-80N, and S-75N, commercially available from Mitsui Chemicals, and Michem® Prime 4990R, commercially available from Michelman, which are all ionomers of ethylene-acrylic acid copolymers.

It has been observed that the adhesion towards the encapsulant, typically an Ethylene Vinyl Acetate (EVA) copolymer, increases when an olefin binder as disclosed above is present in the adhesion layer.

An example of a polyurethane based binder is Incorez W835/494, commercially available from Incorez.

Examples of polyurethane/acrylic hybrid resins are Incorez W2205, commercially available from INCOREZ; Hybridur 870 and Hybridur 878, commercially available from Air Products, EH3070E and EH1050, commercially available from EOC Belgium.

Examples of acrylic resin are JURYMER ET-410 and SEK-301, commercially available from Nihon Junyaku; Encor 2171, commercially available from ARKEMA; Luhydran S945T, Joncryl OH 8312 and Joncryl OH 8313, commercially avalable from BASF; Neocryl XK110, commercially available from DSM; and Setaqua 510, commercially available from Nuplex.

Examples of a composite resin of acrylic and silicone are CERANATE WSA 1060, WSA 1070 commercially available from DIC Corporation; and H7620, H7630 and H76S0 commercially available from Asahi Kasei Corporation.

A particular preferred adhesion layer comprises a polyolefin binder and a polyurethane/acrylic hybrid resin.

The total amount of binder of the adhesion layer is preferably between 0.5 and 5 g/m$^2$, more preferably between 1 and 3 g/m$^2$.

The adhesion layer may be provided on the support by any known coating techniques such as roll coating, knife coating, gravure coating, or curtain coating.

The adhesion layer may be coated inline during the manufacture of the support, preferably a Biaxially Oriented PolyEthylene Terephthalate (BOPET) support.

The adhesion layer may be provided on the BOPET support, or may be provided between longitudinal and transversal stretching of the PET support.

A primer may be provided between the adhesion layer and the BOPET support, to improve the adhesion towards the support.

White Pigment

The adhesion layer preferably comprises a white pigment to maximize the reflection of sunlight thereby increasing the efficiency or the solar cell module.

There are no particular limitations on the white pigment, so long as it is a white colored pigment, and the white pigment may be an inorganic pigment or an organic pigment.

Examples of the inorganic pigment include titanium oxide, barium sulfate, silicon oxide, aluminum oxide, magnesium oxide, calcium carbonate, kaolin, talc, indigo, Prussian blue, and carbon black, and examples of the organic pigment include phthalocyanine blue, and phthalocyanine green.

The volume average particle size of the white pigment is preferably 0.03 μm to 0.8 μm, and more preferably 0.15 μm to 0.50 μm. When the volume average particle size of the white pigment is in this range, a decrease in the light reflection efficiency can be suppressed. The volume average particle size of the white pigment is a value measured by a laser diffraction/scattering type particle size distribution analyzer, LA9S0; trade name, manufactured by Horiba, Ltd.

The amount of white pigment in the adhesion layer is preferably between 0.5 and 7.5 g/m$^2$, more preferably between 1 and 5 g/m$^2$, most preferably between 1.5 and 3 g/m$^2$.

The adhesion layer may also contain a colorant (pigment or dye) other than the white pigment.

Inorganic Oxide Filler

The adhesion layer preferably further contains an inorganic oxide filler.

The inorganic oxide filler is preferably silica, magnesium oxide, and tin oxide, more preferably tin oxide or silica, most preferably silica.

The volume average particle size of the inorganic oxide filler is preferably 5 nm to 500 nm, and more preferably 10 nm to 250 nm. The volume average particle size of the inorganic oxide filler is a value measured by a laser diffraction/scattering type particle size distribution analyzer, LA950; trade name, manufactured by Horiba, Ltd.

The shape of the fine particles is not particularly limited, and any of spherical, amorphous and needle-shaped particles and the like can be used.

The amount of inorganic oxide filler is preferably between 0.01 and 2 g/m$^2$, 0.025 and 1 g/m$^2$, most preferably between 0.05 and 0.5 g/m$^2$.

Other Crosslinking Agents

The core/shell polyisocyanate crosslinking compound may be combined with other crosslinking agents.

Examples of such crosslinking agent include epoxy-based, isocyanate-based, melamine-based, carbodiimide-based, and oxazoline-based crosslinking agents.

The core/shell polyisocyanate crosslinking compound is preferably combined with an oxazoline-based crosslinking agent.

Examples of oxazoline-based cross-linking agents include 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, 2-isopropenyl-5-ethyl-2-oxazoline, 2,2'-bis-(2-oxazoline), 2,2'-methylene-bis-(2-oxazoline), 2,2'-ethylene-bis-(2-oxazoline), 2,2'-trimethylene-bis-(2-oxazoline), 2,2'-tetramethylene-bis-(2-oxazoline), 2,2'-hexamethylene-bis-(2-oxazoline), 2,2'octamethylene-bis-(2-oxazoline), 2,2'-ethylene-bis-(4.4'-dimethyl-2-oxazoline), 2,2'-pphenylene-bis-(2-oxazoline), 2,2'-m-phenylene-bis-(2-oxazoline), 2,2'-m-phenylene-bis-(4.4'dimethy-2-oxazoline), bis-(2-oxazolinylcyclohexane)sulfide, bis-(2-oxazolinylnorbomane)sulfide, and the like.

Polymers or copolymers of the above disclosed oxazolines may also be used in combination with the core/shell polyisocyanate compound.

Commercial products can be used as the oxazoline-based cross-linking agent. Examples of the commercial products include EPOCROS K2010E, K2020E, K2030E, WS500, WS700 (trade name, all manufactured by NIPPON SHOKUBAI CO., LTD), and the like.

Other preferred crosslinking agents that may be used in combination with the polyisocyanate compound according to the present invention are carbodiimide compounds.

Preferred carbodiimide compound are Carbodilite V02 L2, Carbodilite V02, Carbodilite V04, all commercially available from GSI Europe. A particularly preferred carbodiimide compound is Carbodilite V02 L2.

UV Absorbers

To prevent degradation of the back sheet caused by ultraviolet radiation, the adhesion layer preferably comprises an UV absorber. The UV absorber may be an organic or an inorganic UV absorbing compound.

Preferred inorganic UV absorbers are ZnO and TiO$_2$ particles.

The white pigment described above is preferably used as UV absorbing compound.

Examples of a water dispersible organic UV absorbers are Tinosorb® S aqua and Tinuvin® 99-DW commercially available from BASF; Hostavin® 3041 DISP commercially available from Clariant.

The adhesion layer preferably comprises an inorganic UV absorber and a water dispersible organic UV absorber.

Aqueous Weather Resistant Layer

The aqueous weather resistant layer comprises a water soluble or dispersible binder and a crosslinking agent, wherein the crosslinking agent is a water dispersable core/shell polyisocyanate compound.

The aqueous weather resistant layer preferably further comprises an UV absorber. The weather resistance layer may further comprise additional crosslinking agents, an inorganic oxide filler, surfactants, or matting agents.

Water Soluble or Dispersible Binder

The weather resistant layer may comprise a water soluble or dispersible binder as disclosed above for the aqueous adhesion layer.

To maximize the weather resistance, the weather resistant layer preferably comprises a water soluble or dispersible fluoropolymer.

A preferred water soluble or dispersible fluoropolymer is disclosed in for example EP-A 2309551. The fluoropolymer comprises units based on a fluoroolefin, units based on a crosslinkable group-containing monomer, and units based on an alkyl group-containing monomer wherein a $C_{2-20}$ linear or branched alkyl group having no quaternary carbon atom and a polymerizable unsaturated group are linked to each other by an ether bond or ester bond.

The fluoroolefin may, for example, be chlorotrifluoroethylene (hereinafter referred to as "CTFE"), tetrafluoroethylene (hereinafter referred to as "TFE"), hexafluoro-propylene, vinyl fluoride or vinylidene fluoride. Among them, CTFE or TFE is preferred from the viewpoint of weatherability and solvent resistance of the weather resistant layer.

One type of fluoro-olefin may be used or two or more types may be used in combination. As the proportion of fluoro-olefin monomers in the fluoropolymer becomes larger, the weatherability of the coated film will improve. On the other hand, when it becomes smaller, the solubility of the fluoropolymer will improve. The proportion of fluoro-olefin monomer relative to the total monomer amount is preferably between 30 to 70 mol %, more preferably between 40 and 60 mol %.

The crosslinkable group-containing monomer is a monomer having a crosslinkable group as well as having a polymerizable unsaturated group. The crosslinkable group-containing monomer is preferably a monomer having no quaternary carbon atom or ring structure. The crosslinkable group is preferably a hydroxy group.

The crosslinkable-containing monomer having a hydroxy group as the crosslinkable group is preferably a monomer wherein a $C_{2-20}$ linear or branched alkyl group having a hydroxy group and the above polymerizable unsaturated group are linked to each other by an ether bond or ester bond.

An example of a water soluble or dispersible fluoropolymer comprising a crosslinkable group is Lumiflon FD1000, commercially available from Asahi Glass.

Another water soluble or dispersible fluoropolymer is disclosed in EP-A 2781549. The fluoropolymer may be a homopolymer, a copolymer or a mixture thereof including at least one monomer selected from the group consisting of vinylidene fluoride (VDF), vinyl fluoride (VF), tetrafluoroethylene (TFE), hexafluoropropylene (HFP), chlorotrifluoroethylene (CTFE), trifluoroethylene, hexafluoroisobutylene, perfluorobutylethylene, perfluoro(methylvinylether) (PMVE), perfluoro(ethylvinyl-ether) (PEVE), perfluoro(propylvinylether) (PPVE), perfluoro(hexylvinylether) (PHVE), perfluoro-2,2-dimethyl-1,3-dioxole (PDD) and perfluoro-2-methylene-4-methyl-1,3-dioxolane (PMD) in a polymerized form.

Among these, a polymer or copolymer including vinylidene fluoride (VDF) in a polymerized form may be used. In addition, the fluorine-based polymer may be a copolymer including vinylidene fluoride (VDF) or vinylfluoride (VF) and a comonomer. Here, a kind of the comonomer capable of being included in the fluorine-based copolymer in a copolymerized form is not particularly limited, and may be at least one selected from the group consisting of tetrafluoroethylene (TFE), hexafluoropropylene (HFP), chlorotrifluoroethylene (CTFE), trifluoroethylene, hexafluoroisobutylene, perfluorobutylethylene, perfluoro(methylvinylether) (PMVE), perfluoro(ethylvinylether) (PEVE), perfluoro(propylvinylether) (PPVE), perfluoro(hexylvinylether) (PHVE), perfluoro-2,2-dimethyl-1,3-dioxole (PDD) and perfluoro-2-methylene-4-methyl-1,3-dioxolane (PMD). [0027] For example, the fluorine-based polymer may be polyvinylidene fluoride (PVDF) or polyvinyl fluoride (PVF) including at least one comonomer selected from the group consisting of tetrafluoroethylene (TFE), hexafluoropropylene (HFP), chlorotrifluoro-ethylene (CTFE), trifluoroethylene, hexafluoroisobutylene, perfluorobutylethylene, perfluoro(methylvinylether) (PMVE), perfluoro(ethylvinylether) (PEVE), perfluoro(propylvinylether) (PPVE), perfluoro(hexylvinylether) (PHVE), perfluoro-2,2-dimethyl-1,3-dioxole (PDD) and perfluoro-2-methylene-4-methyl-1,3-dioxolane (PMD) in a polymerized form.

Other examples of aqueous soluble or dispersible fluoropolymers are Neocryl® AF10, an acrylic fluoro copolymer emulsion commercially available from DSM Neoresins; Eterflon® 4302, Eterflon® 4303, Eterflonl® 4311A and Eterflon®4312, all commercially available from Eternal Chemical Co; ZH-01 commercially available from Changshu 3F Zhonghao; and Richflon SRF E620, commercially available from Beijing Sino-Rich Materials Science, and DF-01 commercially available from Shanghai Ofluorine Chemical Technology.

The weather resistant layer preferably comprises a water soluble or dispersible acrylic resin comprising a crosslinkabe group, preferably a hydroxyl group, in combination with the fluoropolymer, in particular when the fluoropolymer does not include a crosslinkable group, such as for example DF-01 and the vinylidene fluoride copolymers disclosed in EP-A 2781549.

The total amount of the water soluble or dispersible binder in the weather resistant layer is preferably between 2.5 and 25 g/m$^2$, more preferably between 5 and 20 g/m$^2$ most preferably between 7.5 and 15 g/m$^2$.

The ratio between the fluoropolymer and the acrylic resin containing a crosslinkable group is preferably between 1/10 and 20/10 more preferably between 2/10 and 10/10 most preferably between 3/10 and 6/10.

UV Light Absorbers—UV Light Stabilizers

To protect the support from ultraviolet radiation, the weather resistant layer preferably comprises a UV absorber.

The aqueous soluble or dispersible UV absorber described above for the adhesion layer may also be used for the weather resistant layer.

Preferred UV absorbers are the TiO$_2$ particles described above.

The amount of the TiO$_2$ particles is preferably between 5 and 30 g/m$^2$, more preferably between 7.5 and 20 g/m$^2$, most preferably between 10 and 15 g/m$^2$.

TiO$_2$ Dispersion

TiO$_2$ particles are typically added to the aqueous coating solutions as aqueous dispersions. To avoid too much water in the coating solutions, the TiO$_2$ dispersions preferably comprise more than or equal to 25 wt %, more preferably more than 40 wt %, most preferably more than 50 wt % of TiO$_2$, relative to the total amount of the dispersion.

To stabilize such concentrated TiO$_2$ dispersion surfactants, polymeric binders or dispersants may be used. However, the presence of such organic stabilizers may result in a decreased scratch resistance of the aqueous layer wherein the TiO$_2$ is used and/or an increased yellowing of the layer upon storage in humid and hot conditions.

It has been observed that more stable TiO$_2$ dispersions can be prepared when the TiO$_2$ particles are stabilized with nano-SiO$_2$ particles.

The TiO$_2$ particles are preferably between 0.05 and 1 µm, more preferably between 0.1 and 0.75 µm, most preferably between 0.15 and 0.50 µm.

The particle size of the nano-SiO$_2$ particles used to stabilize the TiO$_2$ dispersion are preferably between 2 and 50 nm, more preferably between 5 and 25 nm, most preferably between 7.5 and 15 nm.

The nano-SiO$_2$ particles are preferably anionic nano-particles. Such anionic SiO$_2$ particles surrounding the TiO$_2$ may electrostatically stabilize the TiO$_2$ dispersion.

The surface of commerically available anionic nano-SiO$_2$ particles are typically sodium or ammonium stabilized, silane modified or aluminium modified.

Preferred examples are the Bindzil® and Levasil® type of nano-SiO$_2$ particles, commercially available from AKZO NOBEL, such as Levasil 300F, Levasil 500, Levasil 200A/30, Levasil 100/45, Bindzil CC151 HS, Bindzil 159/500, Bindzil 15/750, Bindzil CC301, and Bindzil CC151 HS.

Catalyst

A catalyst may be added to the adhesion layer or the weather resistant layer to improve the crosslinking efficiency of the binder.

Preferred catalysts are Sn, Zn or Bi based catalysts Examples of Sn based catalysts are dibutyl tin dilaurate (DBTL) or dioctyl tin laurate.

Zinc based catalysts are for example K-KAT-XK-622 and XK-614 from King Industries and Octa-Soligen® Zn catalysts from Borchers.

Bismuth based catalysts are preferably used. Bismuth based catalysts are for example Borchi® Kat 0243, Borchi® Kat 0244 and Borchi® Kat 315 from Borchers and Dabco® MB20 from Air Products.

Borchi® Kat 0244 comprises both bismuth and zinc.

The amount of catalyst depends on the type of catalyst but is preferably between 0.005 and 3.00 wt % relative to the total amount of binder having a crosslinkable group, more preferably between 0.05 and 2.00 wt %, most preferably between 0.1 and 1.00 wt %.

Support

The support, also referred to as substrate, used in the backsheet of the present invention is preferably a polymeric support. The support may be provided with additional layers to improve the adhesion towards the encapsulant and/or the weather resistant layer.

Examples of a polymeric support include supports made of polyesters, polyolefins, such as polypropylene and polyethylene, or polyamides, such as polyamide 12 (Nylon 12). Examples of polyesters that can be used for the support are polyethylene terephthalate (PET), polybutylene terephthalate (PBT), 2,6-naphthalene terephthalate (PEN), a copolymer of 1,4-cyclohexanedimethanol, 1,2-ethanediol and 1,4-benzenedicarboxylic acid (PETG) and a copolyester containing isosorbide. The polyester can also be biobased, such as polyethylene isosorbide terephthalate. A particularly preferred support is a PET support.

Production of a Polyester Support

A typical polyester resin production process comprises two phases: an esterification and/or transesterification step of a dicarboxylic acid, or its ester derivative, and a diol compound, followed by a polycondensation step.

Optionally, the resulting polyester after the polycondensation step may be subjected to a so called solid state polymerization to further increase the Molecular Weight (MW) of the polyester, for example to decrease the amount of terminal carboxyl groups.

The resulting polyester resin is then fed to a melt extruder to form a polyester film which is then biaxially stretched to form a biaxially oriented polyester film (i.e. the polyester support) having a specific thickness.

A catalyst is typically used in the polyester production process. Such a catalyst may be present in the esterification step, in the polycondensation step, or in both.

Several other compounds may be added during the polyester production process, to optimize the polymerization reaction and/or the physical properties of the resulting polyester resin or film. Such compounds may be present in the esterification step, in the polycondensation step, in both the esterification and the polycondensation step, or may be added together with the polyester resin to the melt extruder before film formation.

Dicarboxylic Acid

The dicarboxylic acids may be selected from aliphatic, alicyclic and aromatic dicarboxylic acids.

Examples of an aliphatic dicarboxylic acid are malonic acid, succinic acid, glutaric acid, adipic acid, suberic acid, sebacic acid, dodecanedioic acid, dimer acid, eicosane dioic acid, pimelic acid, azelaic acid, methylmalonic acid and ethylmalonic acid.

Examples of an alicyclic dicarboxylic acid are adamantane dicarboxylic acid, norbornene dicarboxylic acid, cyclohexanedicarboxylic acid and decalin dicarboxylic acid.

Examples of an aromatic dicarboxylic acid are terephthalic acid, isophthalic acid, phthalic acid, 1,4-naphthalene dicarboxylic acid, 1,5-naphthalene dicarboxylic acid, 2,6-naphthalene dicarboxylic acid, 1,8-naphthalene dicarboxylic, 4,4'-diphenyl dicarboxylic acid, 4,4'-diphenylether dicarboxylic acid, and 5-sodium-sulfoisophthalic acid.

Preferably, at least one aromatic dicarboxylic acid is used. More preferably, at least 80 wt % of the dicarboxylic acids used is an aromatic dicarboxylic acid. Most preferably, the dicarboxylic acids used are selected from terephthalic acid and isopthalic acid.

Diol Compound

The diol compounds may be selected from aliphatic diol compounds, alicyclic diol compounds and aromatic diol compounds.

Examples of aliphatic diol compounds are ethylene glycol, 1,2-propanediol, 1,3-propanediol, 1,4-butanediol, 1,2-butanediol, and 1,3-butanediol.

Examples of alicylic diol compounds are cyclohexane dimethanol, spiroglycol, isosorbide, and 2,2,4,4-tetramethyl-1,3-cyclobutanediol (CBDO).

Examples of aromatic diol compounds are bisphenol A, 1,3-benzene-dimethanol, and 1,4-benzenedimethanol.

Preferably, at least one aliphatic diol compound is used. Most preferably, ethylene glycol is used as diol compound.

Compounds Having Three or More Carboxyl Groups or Hydroxyl Groups

When using a small amount of compounds having three or more carboxyl groups or hydroxyl groups, branching of the polyester molecular chains may be induced, therefore promoting the entanglement of the polyester chains. As a result, when the polyester molecules are hydrolyzed and the molecular weight of the polyester is thereby lowered, embrittlement of the polyester film can be avoided. Such an entanglement may also inhibit thermal shrinkage of the polyester film. Such compounds and the preferred amounts used thereof are disclosed for example in US2011/0306747, paragraphs [0121] to [0127].

Esterification

The aromatic dicarboxylic acid and the aliphatic diol may be introduced into the production process by preparing a slurry containing these compounds, and supplying the slurry to the esterification phase. The esterification may be carried out using a multistage unit of at least two reactors connected in series, in which ethylene glycol is kept under reflux and water and alcohol formed by the reaction are removed out of the system.

The amount of the aliphatic diol, for example ethylene glycol, is preferably between 1.015 and 1.50 mol per mol of the aromatic dicarboxylic acid, for example terephthalic acid, or its ester derivative, more preferably between 1.10 and 1.30 mol, most preferably between 1.15 and 1.25 mol.
Polycondensation The esterified product produced in the esterification step is then polycondensed. The polycondensation may be carried out in one stage or in multiple stages. The polycondensation is typically carried out under reduced pressure.
Catalyst In the polyester production process, any known conventional catalyst may be used, such as alkali metal compounds, alkaline earth metal compounds, zinc compounds, lead compounds, manganese compounds, cobalt compounds, aluminium compounds, antimony compounds, titanium compounds, germanium compounds, or phosphorus compounds. Preferably an antimony compound, a germanium compound or a titanium compound is used in the polyester production.

Most preferably, a titanium catalyst (Ti catalyst) is used. The Ti catalyst includes oxides, hydroxides, alkoxides, carboxylates, carbonates, oxalates, organic chelate Ti complexes, and halides. Two or more different types of Ti compounds may be used. Preferred Ti catalysts are organic chelate Ti complexes with an organic acid as a ligand. The organic acid may be selected from citric acid, lactic acid, trimellitic acid, and malic acid. Preferably a chelate Ti complex with citric acid as ligand is used. Such a citrate chelate Ti catalyst is commercially available as Tyzor AC422 from Dorf Ketal or Ti184 from Catalytic Technologies.

The catalyst may be added in the esterification phase, in the polycondensation phase or in both phases. The amount of the catalyst is preferably from 1 to 50 ppm, more preferably from 2 to 30 ppm, most preferably from 3 to 15 ppm, in terms of the Ti element.
Phosphorus Compound Preferably, a pentavalent phosphorus compound not having an aromatic ring as a substituent is used in combination with a Ti catalyst.

The pentavalent phosphorus compound may be selected from trimethyl phosphate, triethyl phosphate, tri-n-butyl phosphate, trioctyl phosphate, tris(triethylene glycol) phosphate, methyl acid phosphate, ethyl acid phosphate, monobutyl phosphate, dibutyl phosphate, dioctyl phosphate, and triethylene glycol acid phosphate.

Most preferably trimethyl phosphate and triethyl phosphate are used. In combination with the citrate chelate Ti catalyst mentioned above, using trimethyl phosphate or triethyl phosphate results in a polyester resin having a balanced polymerization activity, color tone and thermal stability.

The pentavalent phosphorus compound is preferably added in the esterification phase, but may also be added to the polycondensation phase or to both phases. The amount of pentavalent phosphorus compound is preferably from 1 to 100 ppm, more preferably from 5 to 50 ppm, most preferably from 7.5 to 25 ppm, in terms of the P element.
Magnesium Compound Adding a magnesium compound (Mg compound) imparts static electricity properties to the resin film. The magnesium compound may be selected from magnesium oxide, magnesium hydroxide, magnesium alkoxide, magnesium acetate, and magnesium carbonate. Among these magnesium compounds, magnesium acetate is preferred.

The Mg compound may be added in the esterification phase, in the polycondensation phase or in both phases. The Mg compound may also be added in the extruder, i.e. in the melt. The amount of the magnesium compound is preferably from 1 to 100 ppm, more preferably from 2 to 50 ppm, most preferably from 3 to 30 ppm, in terms of the Mg element.
Polyester Film Formation After the polycondensation step, the polycondensation product is either directly fed to the melt extruder, or the polycondensate product is first pelletized and then melted in the extruder.

The melt temperature in the extruder is preferably from 250 to 320° C., more preferably from 260 to 310° C., most preferably from 270 to 300° C. The extruder may be a single-screw extruder or a multi-screw extruder. The extruder may be purged with nitrogen to prevent the formation of terminal carboxyl groups through thermal oxidative (or thermo-oxidative) decomposition.

The melt is preferably extruded out through an extrusion die via a gear pump and a filter unit.

The extruded melt is then cooled on one or more chill rolls to form a film thereon. The temperature of the chill rolls is preferably from 5 to 80° C., more preferably from 15 to 70° C., most preferably from 20 to 60° C. When two chill rolls are used, the temperature of both may be different, for example between 5 and 25° C. for the first chill roll and between 30 and 60° C. for the second chill roll.

To enhance the adhesion between the resin melt and the chill roll and to increase the cooling efficiency, static electricity is preferably applied to the chill roll before the melt is brought into contact therewith.

The extruded film is then stretched, preferably biaxially stretched, to obtain the polyester film.

The draw ratio in both the longitudinal and the lateral direction is preferably between 2 and 5. In biaxial stretching, the order of longitudinal stretching (the Machine Direction (MD) or the running direction of the film) and lateral stretching (Cross Direction (CD) or the width direction) is not specifically defined. Preferably, the longitudinal stretching is carried out first.

It is preferred that the lateral draw ratio is larger than the longitudinal draw ratio. Preferably the lateral draw ratio/longitudinal draw ratio is from 1.05 to 1.25, more preferably from 1.10 to 1.20.

The stretching temperature is preferably from 80 to 160° C., more preferably from 85 to 155° C. It is preferred that the stretching temperature in the latter stretching, preferably the lateral stretching, is higher than the temperature in the former stretching, preferably the longitudinal stretching.

Besides this stepwise biaxially stretching method, wherein stretching in a longitudinal direction and stretching in a width direction are performed separately, a simultaneous biaxially stretching method, wherein stretching in a longitudinal direction and stretching in a lateral direction are performed at the same time, may also be used.

In order to complete crystal orientation and to impart flatness and dimensional stability to the biaxially stretched film, the film is preferably subjected to a heat treatment for 1 to 30 sec while the sides of the biaxially stretched film are fixed, preferably at a temperature equal or higher than the glass transition temperature (Tg) of the resin but lower than the melting temperature (Tm) thereof. Such a heat treatment is then followed by a uniform and gradual cooling to room temperature.

Such a treatment is often referred to as thermofixation.

When the thermofixation temperature is too low, the heat shrinkage of the resulting film increases. On the other hand, when the heat treatment temperature is too high, the hydrolytic stability of the resulting film decreases. Preferred thermofixation temperatures are between 160 and 250° C., more preferably between 175 and 235° C., most preferably between 200 and 225° C.

In addition to and after the thermofixation, a so called relaxation treatment may be carried out. Such a relaxation treatment is preferably carried out at a temperature from 80 to 160° C., more preferably from 100 to 140° C. The degree of relaxation is from 1 to 30%, more preferably from 2 to 25%, most preferably from 3 to 20%.

The relaxation may be attained in the lateral or longitudinal direction of the film, or in both directions.

Thickness of the Film

The thickness of the biaxially stretched polyester film is preferably between 75 µm and 500 µm, more preferably between 100 µm and 350 µm, most preferably between 125 µm and 275 µm.

Carboxyl Groups in the Polyester

Carboxyl groups present in the polyester may work as an acid catalyst in the hydrolysis of polyester molecules. Such hydrolysis, for example when the polyester is kept for a certain period of time in high moisture conditions, results in a decrease of the molecular weight and therefore in a decrease of the mechanical strength of the polyester film. To obtain a sufficient hydrolytic stability of the polyester film, the carboxyl group content is preferably as low as possible.

On the other hand, carboxyl groups at the surface of the polyester film may enhance the adhesion between the polyester film and layers provided thereon. For that reason, the carboxyl group content is preferably not zero.

The carboxyl group content of the polyester film is preferably between 0 and 40 meq/kg, more preferably between 5 and 20 meq/kg.

To ensure low concentrations of carboxyl groups in the polyester film, high temperatures during the complete preparation process of the film, for example during the polycondensation process, are kept as low as possible.

To further reduce the number of carboxyl groups of the polyester, compounds that react with a carboxyl group of the polyester may be added to the polyester. Examples of such compounds include carbodiimide compounds, epoxy compounds, and oxazoline compounds.

Carbodiimide Compounds

The carbodiimide compounds may be classified into monofunctional and polyfunctional carbodiimides. Examples of monofunctional carbo-diimides include N,N'-dicyclohexylcarbodiimide, 1,3-diisopropyl-carbodiimide, N,N'-diisopropylphenylcarbodiimide, N,N'-dimethyl-carbodiimide, N,N'-diisobutylcarbodiimide, N,N'-dioctylcarbodiimide, t-butylisopropylcarbodiimide, N,N'-diphenylcarbodiimide, N,N'-di-t-butyl-carbodiimide, 1-(3-dimethylaminopropyl)-3-ethyl carbodiimide, and dinaphthyl carbodiimide.

Examples of commercially available carbodiimide compounds include Stabaxol I from Rheinchemie and Stablizer 7000 from Rashig, both based on N,N'-diisopropylphenyl-carbodiimide.

Polyfunctional carbodiimides are typically polycarbodiimide compounds, i.e. a polymer obtained by polymerizing a carbodiimide compound. An specific example of such a polycarbodiimide is poly(1,3,5-triisopropylphenylene-2,4-dicarbodiimide).

Examples of commercially available polymeric carbodiimides include Stabilizer 9000 from Raschig and Stabaxol P from Rheinchemie.

Other polymeric carbodiimides available from Rheinchemie are Stabaxol P100 and Stabaxol P200.

As carbodiimide compounds may generate an isocyanate-type gas through thermal decomposition, carbodiimide compounds having a high heat resistance are preferably used. It has been observed that an increase in molecular weight of polymeric carbodiimides, results in an improvement of the thermal decomposition.

Epoxy Compounds

Preferred examples of the epoxy compounds include glycidyl compounds. Preferred examples are those disclosed in WO2012120260 (for example Cardura E10P).

Other preferred epoxy compounds are epoxidized fatty acid esters or epoxidized fatty acid glycerides such as disclosed in US2010/0120946 paragraphs [0020] to [0067].

Still other preferred epoxy compounds are the so called chain extenders disclosed in for example US2010/0120947. Chain extenders are molecules with at least two reactive groups, preferably an epoxy group, which can react with the polyester during extrusion and join polyester chains to one another. Typically, their reactive groups are already depleted substantially (to an extent of 75% or more) during the extrusion and are no longer available for a chain repair during the use of the polyester film after the production thereof.

Preferred chain extenders are difunctional epoxides, even more preferred chain extenders are polyfunctional epoxides. The epoxy function is arranged terminally at the end of the molecule chain or of a side chain. Polyfunctional epoxides are preferred since lower amounts are required, higher molecular weight end products are formed, and lower level of gaseous cleavage products are formed. Commercially available chain extenders include polymers sold by BASF under the Joncryl ADR brand name.

Oxazoline Compounds

The oxazoline compounds are preferably bisoxazoline compounds such as 2,2'-bis(2-oxazoline), 2,2'-bis(4-methyl-2-oxazoline), 2,2'-bis(4,4'-dimethyl-2-oxazoline), 2,2'-bis(4-methyl-2-oxazoline), 2,2'-bis(4-ethyl-2-oxazoline), 2,2'-bis(4,4'-diethyl-2-oxazoline),2,2'-bis(4-propyl-2-oxazoline), 2,2'-bis(4-butyl-2-oxazoline), 2,2'-bis(4-hexyl-2-oxazoline), 2,2'-bis(4-phenyl-2-oxazoline), 2,2'-bis(4-cylcohexyl-2-oxazoline), 2,2'-bis(4-benzyl-2-oxazoline), 2,2'-p-phenylenebis(2-oxazoline), 2,2'-m-phenylenebis(2-oazoline), 2,2'-o-phenylenebis(2-oxazoline), 2,2'-p-phenylene-bis(4-methyl-2-oxazoline), 2,2'-p-phenylenebis(4,4-dimethyl-2-oxazoline), 2,2'-m-phenylenebis(4,4-dimethyl-2-oxazoline), 2,2'-m-phenylenebis(4-methyl-2-oxazoline), 2,2'-m-phenylenebis(4,4-dimethyl-2-oxazoline), 2,2'-ethylenebis(2-oxazoline), 2,2'-tetramethylenebis(2-oxazoline), 2,2'-hexamethylenebis(2-oxazoline), 2,2'octamethylenebis (2-oxazoline), 2,2'-decamethylenebis(2-oxazoline), 2,2'-ethylenebis(4-methyl-2-oxazoline), 2,2'-ethylenebis(4,4-dimethyl-2-oxazoline), 2,2'-9,9'-diphenoxyethanebis(2-oxazoline), 2,2'-cyclohexylenebis(2-oxazoline) and 2,2'-diphenylenebis(2-oxazoline). Among these, 2,2'-bis(2-oxazoline) is most preferably used from the viewpoint of reactivity with the polyester.

A particularly preferred oxazoline compound is 2-Phenyl-4,5-dihydro-oxazole and 4,5-Dihydro-2-phenyl-6H-1,3-oxazine.

The bisoxazoline compounds may be used individually, or two or more different compounds may be used together.

The amount of the carbodiimide compounds, the epoxy compounds, or the oxazoline compounds in the polyester film is typically from 0.1 to 5 wt %, preferably from 0.3 to 4 wt %, more preferably from 0.5 to 3 wt %, relative to the total weight of the polyester resin.

UV Light Absorber/UV Light Stabilizer

To prevent degradation caused by UV light, UV light absorbers and/or UV light stabilizers may be added to the polyester film. UV light absorbers absorb UV light and convert it into heat energy, while UV light stabilizers scavenge radicals generated by photodecomposition of the polyester resin and prevent further decomposition of the resin. A degradation of the polyester resin may result in a decrease of the partial discharge voltage, in a decrease of the strength of the polyester film, and in a color tone change (for example yellowing) of the polyester film.

The UV light absorbing compound may be an organic or an inorganic UV absorbing compound.

Examples of organic UV light absorbers include salicyl acid compounds such as p-t-butylphenylsalicylate or p-octylphenyl salicylate, benzophenone compounds such as 2,4-dihydroxy benzophenone, 2-hydroxy-4-methoxy benzophenone, 2-hydroxy-4-methoxy-5-sulfo benzophenone, 2,2'4,4'-tetrahydroxy benzophenone, and bis(2-methoxy-4-hydroxy-5-benzoylphenyl)methane, benzotriazole compounds such as 2-(2'-hydroxy-5'-methylphenyl)benzotriazole and 2,2'-methylene bis[4-(1,1,3,3-tetramethylbutyl)-6-(2H-benzotriazole-2-yl)phenol], cyanoacrylate compounds such as ethyl-2-cyano-3,3'-diphenyl acrylate, triazine compounds such as 2-(4,6-diphenyl-1,3,5-triadizine-2-yl)-5-[(hexyl)oxy]-phenol (Tinuvin 1577) and 2-(2-Hydroxy-4-(2-ethylhexyl)oxyphenyl)-4,6-di(4-phenylphenyl)-1,3,5-triazine (Tinuvin 1600) and, 2-[4-[4,6-bis ([1,1'-biphenyl]-4-yl)-1,3,5-triazin-2-yl]-3-hydroxyphenoxy]-propanoic acid isooctyl ester (Tinuvin 479).

Examples of inorganic UV absorbers are $TiO_2$ particles, ZnO particles and mixtures thereof.

Examples of UV light stabilizers are hindered amine compounds such as bis(2,2,6,6-tetramethyl-4-piperidyl)sebacate and the polycondensate of dimethylsuccinate and 1-(2-hydroxyethyl)-4-hydroxy-2,2,6,6-tetramethyl piperidine.

The content of the UV light absorber or UV light stabilizer in the polyester resin composition is preferably from 0.1 to 10 wt %, more preferably from 0.3 to 7 wt %, even more preferably from 0.7 to 4 wt %.

Other Additives

It is preferred to add inorganic particles to the polyester to optimize properties as slipperiness, abrasion resistance, scratch resistance of the surface of the polyester film. Examples of inorganic particles are for example particles of clay, mica, titanium oxide, calcium carbonate, kaolin, talc, silica, calcium phosphate, barium sulfate, alumina, and zirconia.

Preferred inorganic particles are silica and alumina. The amount of silica and/or alumina is preferably between 0.025 and 1.500 wt %, more preferably between 0.050 and 1.000 wt %.

Optical brighteners such as 2,5-thiophenediylbis(5-tert-butyl-1,3-benzoxazole) (Uvitex OB, Benetex OB Plus) may also be added to the polyester.

Master Batch Technology

It is preferred that additives such as inorganic particles, UV light absorbing compounds, additives to improve the hydrolytic resistance are added to the polyester resin by means of a so called master batch. To prepare such a master batch, the additive is first dispersed in a carrier material. The carrier material is preferably polyester, but it may be another polymer which is compatible with polyester. The master batch is added to the polyester in the melt extruder, before film production, resulting in the components of the master batch being dissolved or finely dispersed in the polyester.

Surface Treatment

The polymeric support may be surface treated, typically to enhance the adhesion between the support and layers provided thereon.

Examples of such a surface treatment include a corona discharge treatment, a flame treatment, an UV treatment, a low pressure plasma treatment, and an atmospheric plasma treatment. A chemical treatment of the surface is also known in the art.

In a corona discharge treatment, typically high frequency and high voltage electricity is applied between a metal roll coated with a dielectric substance and insulated electrodes to induce ionization of the air between the electrodes, i.e. a corona discharge. A corona discharge treatment of the support is performed by passing the support through the corona discharge. Coronization may also been performed in modified atmospheric conditions.

For example, a gap distance between the electrodes and the dielectric roll may be from 1 to 3 mm, a frequency of 1 to 100 kHz, and an applied energy of 0.2 to 5 $kV \cdot A \cdot min/m^2$ may be used.

In a flame treatment, the outer flame portion of a flame is brought into contact with the support. Care has to be taken that the flame, uniformly hits the support surface. This may be achieved by using plural, circular-shaped burners. Examples of the combustion gas that may be used in a flame treatment include paraffin-based gases such as natural gas, methane gas, ethane gas, propane gas and butane gas, and olefin-based gases such as ethylene gas, propylene gas, and acetylene gas. These gases may be used singly, or as mixtures of two or more gases. Oxygen or air is preferably used as an oxidizing gas that is mixed with the combustion gas.

A flame treatment as disclosed in US2011/0284075, paragraph [0247] to [0258] is preferably used to optimize the surface energy of the polymeric support.

In an UV treatment, the surface of a support is irradiated with UV radiation to improve its adhesiveness and wettability. Typically, a low pressure mercury UV lamp is used as an UV radiation source. Preferably UV radiation at 254 nm, more preferably at 185 nm is used in such a UV treatment. The UV treatment is typically carried out for 1 to 500 seconds under atmospheric pressure.

In a low pressure plasma treatment, the surface of the support is treated with plasma, generated as a result of a discharge in a gas, the plasma gas, in a low pressure atmosphere. Examples of plasma gas that may be used include oxygen gas, nitrogen gas, water vapor gas, argon gas and helium gas. Preferably oxygen, or a mixed gas of oxygen gas and argon gas, are used. The pressure of the plasma gas is preferably in the range of 0.005 to 10 Torr, more preferably in the range of 0.008 to 3 Torr. The plasma output power is preferably from 100 to 2500 W, more preferably from 500 to 1500 W. The treatment time is preferably from 0.05 to 100 seconds, more preferably from 0.5 to 30 seconds. The plasma may be generated using a direct current glow discharge, a high frequency wave discharge, or a microwave discharge.

In an atmospheric pressure plasma treatment, a stable plasma discharge is generated at atmospheric pressure using high frequency waves. Argon gas or helium gas may be used as carrier gas. Oxygen gas may be mixed with the carrier gas. The atmospheric pressure plasma treatment is preferably carried out at atmospheric pressure or a pressure close to or below the atmospheric pressure, such as between 500 and 800 Torr. The power supply frequency of the discharge is preferably 1 to 100 kHz, more preferably 1 to 10 kHz. The discharge intensity is preferably from 50 to 500 W·min/m².

Solar Cell Module

FIG. 2 schematically represents an embodiment of a photovoltaic module according to the present invention.

The solar cell module (4) has a configuration in which a solar cell element (4), which converts the light energy of sunlight to electrical energy, is disposed between a transparent sheet (2) through which sunlight enters (also referred to as the frontsheet) and the backsheet (1) according to the present invention. The solar cell element (4) is encapsulated by an encapsulant or sealing layer (3, 3').

Such a solar cell module is typically prepared by laminating all components, i.e. backsheet, front sheet, encapsulant sheets and the solar cell element, in one step.

A preferred embodiment of a backsheet (1) according to the present invention is schematically represented in FIG. 3.

The backsheet (1) comprises a polymeric support (300), on one side of the support a weather resistant layer (200) and an adhesion layer (100) on the other side of the support.

To simplify the assembly of a solar cell module by the module manufacturer, it may be preferred to integrate the backsheet (1) and the encapsulant layer (3'). Such an "intergrated backlayer" may have a positive influence on the cost price of the solar cell module.

EXAMPLES

Materials

All materials used in the examples were readily available from standard sources such as Aldrich Chemical Co. (Belgium) and Acros (Belgium) unless otherwise specified.

Bayhydur XP2655 sol s a 40 wt % aqueous solution of Bayhydur XP2655.

Bayhydur XP2655 is a hydrophilic aliphatic polyisocyanate based on hexamethylene diisocyanate (HDI) commercially available from BAYER.

Burnock L-PU 893 sol is a 40 wt % aqueous solution of Burnock L-PU 893.

Burnock L-PU 893 is an aliphatic core/shell polyisocyanate based on HDI trimers, commercially available from DIC.

Silane Z-6040 is a glycidoxypropyltrimethoxysilane, commercially available from DOW CORNING.

Incorez W2205 a polyurethane/acrylic hybrid dispersion, commercially available from INCOREZ.

DR306 is a surfactant solution according to the following table.

| g of component | DR306 |
|---|---|
| Chemguard S228 | 52.6 |
| Chemguard S550 | 52.6 |
| Isopropanol | 473.0 |
| water | 431.0 |

Chemguard 5-228 is a fluorsurfactant, commercially available from CHEMGUARD.

Chemguard 5-550 is a 50.0 wt % solution of a fluorosurfactant commercially available from CHEMGUARD.

Tividasol is a 2.5 wt % solution in DW and ethanol (50/50) of TIVIDA FL2500.

TIVIDA FL2500 is a fluorsurfactant commercially available from MERCK.

DR212 is a 8.55 wt % aqueous dispersion of Sunsphere H51.

Sunsphere H51 is a silica, commercially available from ASAHI GLASS.

Chemipearl 580N is a polyolefin resin commercially available from MITSUI CHEMICALS.

Tinosorb 5 aqua is an aqueous dispersion of a UV absorber (20 wt %), commerically available from BASF.

PV Tisol is a $TiO_2$ dispersion prepared as follows: 215.8 g of Levasil 500, 212.3 g or demineralised water (DW) and 5.2 g of Proxel K disp were mixed in a vessel using a DISPER-LUX™ dispenser. Then, 650 of RDI-S $TiO_2$ was added under agitation. Stirring was continued for 30 minutes, after which 107.5 g of DW and 109.2 g of Kieselsol 500 were added to obtain the final concentration. The system was stirred for another 5 minutes. The resulting concentrated pigment dispersion exhibited an average particle size of 289 nm as measured with a Malvern™ nano-S and a viscosity of 13 mPa·s at 25° C. and at a shear rate of 10 $s^{-1}$.

Proxel K disp is a 0.4 wt % dispersion of the biocide Proxel K.

Proxel K a 5 wt % aqueous solution of 1,2-benzisothiazoline-3-one potassium salt (CASRN 127553-58-6, commercially available from Prom Chem).

RDI-5 is an alumina surface treated rutile titanium dioxide pigment, commercially available from SACHTLEBEN.

Levasil 500 is a silica from AKZO NOBEL.

Hydran AP20 a polyester urethane commercially available from DIC.

Hydran AP40N a polyester urethane commercially available from DIC.

Paresin is a dimethyltrimethylolamine formaldehyde resin from CYTEX INDUSTRIES.

Dowfax 2A1 is an anionic surfactant from DOW CHEMICALS.

Surfynol 420 is a non-ionic surfactant from AIR PRODUCTS.

Measurement Methods

Pinholes

The occurrence of pinholes in the coated layers were evaluated visually by counting the number of pinholes on approximately 63 cm² of a coated layer viewed on a Copex LF505 (magnification is 2×).

In addition photographs were taken of the coated layers using a Leica light microscope, commercially available from Leica-microsystems, using a 10× and 50× magnification.

Adhesion

The coatings were tested for adhesion using the Cross-Hatch test method. Additionally, the adhesion was tested after 45 hours Pressure Cooker Test wherein the samples are kept for 45 hours at a temperature of 121° C. and a Relative Humidity (RH) of 100%, under pressure with moisture condensation. The adhesion was ranked using the BS/ISO/DIN reporting system, i.e. from 0 to 5 wherein 0-1 is considered an acceptable adhesion and 2-5 a bad adhesion.

Yellowing

In a Damp Heat Test (DHT), the samples were kept at 85° C. and a relative humidity (RH) of 85% for 1000 hours. Colour changes during storage were evaluated by CIE ΔE (1976) and the Yellowness Index $YI_{313}$ (ASTM E313).

Example 1

This example illustrates the advantage of using a water dispersible core/shell compound in a water-based adhesion layer.

Preparation of the BOPET Support

A 2715 μm thick polyethylene terephthalate (PET) sheet was first longitudinally stretched (×3.13) and then coated one side with a aqueous primer (wet coating thickness of 10 μm) of which the dry composition is shown in Table 1. After drying, the longitudinally stretched and coated PET was transversally stretched (×3.33) to obtain a 260 μm thick biaxially stretched PET (BOPET) sheet comprising a primer on one side.

TABLE 1

| Ingredients (mg/m$^2$) | |
| --- | --- |
| Hydran AP20 | 101.80 |
| Hydran AP40N | 101.50 |
| Paresin | 8.10 |
| Dowfax 2A1 | 1.10 |
| Surfynol 420 | 1.10 |
| Matting agent | 1.70 |

The Adhesion Layers AL-01 to AL-04 were obtained by coating the solutions of Table 2 using a Baker coating applicator at 45° C. on the primer of the BOPET support describe in Example 1. The wet coating thickness was 33 μm, the coating was dried 120° C. for 10 minutes.

TABLE 2

| Ingredients (g) | AL-01 | AL-02 | AL-03 | AL-04 |
| --- | --- | --- | --- | --- |
| DW | 933.5 | 928.5 | 747.0 | 742.0 |
| Silane Z-6040 | 8.3 | = | 8.3 | = |
| Incorez W2205 | 104.2 | = | 104.2 | = |
| Chemipearl S80N | — | — | 138.9 | = |
| DR306 | 5.0 | = | 5.0 | = |
| Tividasol | 3.3 | = | 3.0 | = |
| Tinosorb S aqua | — | — | 7.5 | = |
| PV Tisol | 70.0 | = | 133.3 | = |
| Bayhydur XP2655 | 8.33 | = | 8.33 | — |
| Burnock L-PU8983 | — | 12.5 | — | 12.5 |

The obtained dry coating weight of the adhesion layers AL-01 to AL-04 is given in Table 3.

TABLE 3

| Ingredients (g/m$^2$) | AL-01 | AL-02 | AL-03 | AL-04 |
| --- | --- | --- | --- | --- |
| Silane Z-6040 | 0.25 | = | 0.25 | = |
| Incorez W2205 | 1.250 | = | 1.250 | = |
| Chemipearl S80N | — | — | 1.0 | = |
| Chemquard S-228 | 0.0043 | = | 0.0043 | = |
| Chemquard S-550 | 0.0043 | = | 0.0043 | = |
| Tividasol | 0.00225 | = | 0.00225 | = |
| Tinosorb S aqua | — | — | 0.09 | = |
| PV Tisol | 1.050 | = | 2.000 | = |
| Bayhydur XP2655 | 0.250 | = | 0.250 | — |
| Burnock L-PU8983 | — | 0.3 | — | 0.3 |

The adhesion layers AL-01 to AL-04 were evaluated towards pinholes by light microscopy (magnification ×10 and ×50). An example of a 50× magnification is given for AL-01 to AL-04 in FIG. 1.

The results clearly indicated that the adhesion layers 01 and 03 showed an unacceptable amount of pinholes, while for the adhesion layers 02 and 04 almost no pinholes are observed.

This clearly indicated that by using a core/shell polyisocyanate compound an acceptable level of pinholes in the water based adhesion layer may be obtained.

The invention claimed is:

1. A backsheet for a photovoltaic module, the backsheet comprising:
   a support;
   an adhesion layer provided on a first side of the support; and
   an outer layer provided on a second side of the support; wherein
   at least one of the adhesion layer and the outer layer is coated from an aqueous composition including a water soluble or water dispersible binder and a water dispersible core and shell polyisocyanate;
   the core of the polyisocyanate includes an aliphatic hydrophobic polyisocyanate; and
   the shell of the polyisocyanate includes a polymer including a hydrophilic dispersing group and a hydrophobic isocyanate-shielding group, wherein the hydrophobic isocyanate-shielding group is selected from the group consisting of a polyacrylate, a polyester, a polyurethane, a polycarbonate, a polyolefin, and a polyimide.

2. The backsheet according to claim 1, wherein the water soluble or water dispersible binder of the adhesion layer is selected from the group consisting of an acrylic resin, a polyolefin, a polyurethane, and a urethane-acrylic hybrid polymer.

3. The backsheet according to claim 1, wherein the water soluble or water dispersible binder of the outer layer is selected from the group consisting of an acrylic resin and a fluoropolymer.

4. The backsheet according to claim 2, wherein the water soluble or water dispersible binder of the outer layer is selected from an acrylic resin and a fluoropolymer.

5. The backsheet according to claim 4, wherein the acrylic resin includes a crosslinkable group.

6. A photovoltaic module comprising:
   the backsheet as defined in claim 4.

7. A method of manufacturing a backsheet for a photovoltaic module, the method comprising the steps of:
   providing a support;
   applying an adhesion layer to a first side of the support; and
   applying an outer layer to a second side of the support; wherein
   at least one of the step of applying the adhesion layer and the step of applying the outer layer includes applying the adhesion layer or the outer layer from an aqueous composition including a water soluble or water dispersible binder and a water dispersible core/shell polyisocyanate;
   the core of the polyisocyanate includes an aliphatic hydrophobic polyisocyanate; and
   the shell of the polyisocyanate includes a polymer including a hydrophilic dispersing group and a hydrophobic isocyanate-shielding group, wherein the hydrophobic isocyanate-shielding group is selected from the group consisting of a polyacrylate, a polyester, a polyurethane, a polycarbonate, a polyolefin, and a polyimide.

* * * * *